United States Patent [19]

Witucki et al.

[11] Patent Number: 4,697,000

[45] Date of Patent: Sep. 29, 1987

[54] PROCESS FOR PRODUCING POLYPYRROLE POWDER AND THE MATERIAL SO PRODUCED

[75] Inventors: Edward F. Witucki, Van Nuys; Leslie F. Warren, Camarillo, both of Calif.

[73] Assignee: Rockwell International Corporation, El Segundo, Calif.

[21] Appl. No.: 883,202

[22] Filed: Jul. 8, 1986

Related U.S. Application Data

[63] Continuation-in-part of Ser. No. 646,717, Sep. 4, 1984, Pat. No. 4,617,228.

[51] Int. Cl.$^4$ .................... C07D 207/30; C08G 73/20; H01B 1/12
[52] U.S. Cl. .................................. 528/423; 252/500; 252/519; 526/258; 427/121; 428/265
[58] Field of Search ................ 252/500, 519; 427/121; 528/423; 526/258; 428/265

[56] References Cited

U.S. PATENT DOCUMENTS 4,567,250 1/1986 Naarmann et al. ............. 252/500 X
4,568,483 2/1986 Naarmann et al. ............. 252/518 X

*Primary Examiner*—Michael R. Lusignan
*Attorney, Agent, or Firm*—Charles T. Silberberg; Max Geldin

[57] ABSTRACT

Production of electrically conductive polypyrrole powder, by treating a liquid pyrrole with a solution of a strong oxidant, capable of oxidizing pyrrole to a pyrrole polymer, and oxidizing the pyrrole by such strong oxidant in the presence of a substantially non-nucleophilic anion and precipitating a conductive polypyrrole powder. The strong oxidant, e.g., $Fe^{3+}$ ion, and non-nucleophilic anion, e.g., sulfate or chloride ion, can be derived from a single compound, e.g., $FeCl_3$ or $Fe_2(SO_4)_3$. The anion serves as dopant for the polypyrrole. The reaction can be carried out in aqueous solution or in an organic solvent medium, such as acetonitrile.

15 Claims, No Drawings

4,697,000

PROCESS FOR PRODUCING POLYPYRROLE POWDER AND THE MATERIAL SO PRODUCED

This application is a continuation-in-part of U.S. application Ser. No. 646,717, filed Sept. 4, 1984, of Paul R. Newman, Leslie F. Warren, Jr., and Edward F. Witucki, now U.S. Pat. No. 4,617,228, patented Oct. 14, 1986.

BACKGROUND OF THE INVENTION

The present invention relates to the production of electrically conductive polypyrrole and is particularly concerned with a process for converting pyrroles to conductive polypyrrole powder using chemical procedures.

Polypyrrole represents one of the most environmentally stable conducting organic polymers. Its usual preparation has involved electrochemical oxidation of pryrroles in various solvents, with films of the conducting materials depositing on the anode. Thus, free-standing polypyrrole films from about 10 μm to 20 mil thick have been produced on electrodes by electrochemical polymerization. However, these prior art films are too thin and too brittle to be useful in most structurally related applications.

U.S. Pat. No. 4,552,927 to L. F. Warren discloses a conductive polypyrrole which can be produced in thicker layers and has increased mechanical flexibility as compared to prior art polypyrrole film, obtained by electropolymerizing pyrrole from an electrolyte containing a non-nucleophilic polymeric anion, such as polystyrenesulfonate, and pyrrole.

U.S. Pat. No. 4,582,575, to L. F. Warren, D. S. Klivans and L. Maus, discloses an electrically conductive composite comprising a dielectric porous substance, such as fiberglass fabric, and an electrically conductive pyrrole polymer deposited in the pores of such substance, by contacting such porous substance with an anode in an electrolytic cell containing an electrolyte comprising a pyrrole monomer and a substantially non-nucleophilic anion, such as sulfate, and electrochemically depositing a conductive pyrrole polymer in the pores of such substance. However, the resulting conductive polypyrrole does not have the bulk and ductility required to make the material useful in structural-related applications.

U.S. application Ser. No. 646,717, filed Sept. 4, 1984, of P. R. Newman, L. F. Warren, Jr., and E. F. Witucki, and assigned to the same assignee as the present application, discloses a chemical process for producing an electrically conductive composite which comprises contacting a dielectric porous substance, such as fiberglass fabric with a liquid pyrrole, contacting the porous substance with a solution of a strong oxidant capable of oxidizing pyrrole to a pyrrole polymer, such as ferric cation, and oxidizing the pyrrole in the presence of a substantially non-nucleophilic anion, such as sulfate, and precipitating a conductive pyrrole polymer in the pores of such substance.

An object of the present invention is the provision of a process for producing electrically conductive polypyrrole, which avoids electrochemical preparation.

Another object is to provide procedure for producing electrically conductive polypyrrole powder, which can be used in the production of conductive structural materials.

A still further object is the provision of electrically conductive powder produced by the above process.

SUMMARY OF THE INVENTION

The above objects are achieved by reacting a pyrrole, e.g., pyrrole or a derivative thereof, e.g., its N-substituted derivative, with a strong oxidant, in the presence of a substantially non-nucleophilic anion, to form a precipitate of the doped polypyrrole.

A suitable oxidizing agent, for example, is a salt of $Fe^{3+}$, (e.g., $FeCl_3$), the reduced species of which may remain soluble and/or separable from the precipitated polymer, following the reaction. The oxidant counterion, which comprises the non-nucleophilic anion, is incorporated in the polymer as the dopant. Thus, in one example, an excess of anhydrous $FeCl_3$ in acetonitrile was treated with pyrrole, resulting in a precipitate of conductive polypyrrole.

The conductive polypyrrole powder can be incorporated as suspensions in various matrices, e.g., epoxy, or encapsulated therein, and subsequently used as semiconducting structured materials.

These and other objects and features of the invention will become apparent from the following detailed description thereof.

DESCRIPTION OF THE PREFERRED EMBODIMENTS

The liquid pyrrole treating solution can comprise neat liquid pyrrole, a C-substituted pyrrole, such as a 3-or 3,4- alkyl or aryl substituted pyrrole, e.g., 3-methylpyrrole, 3,4-dimenthylpyrrole, 3-phenylpyrrole or 3-methyl-4-phenylpyrrole, an N-substituted pyrrole, e.g., an N-alkylpyrrole, such as N-methylpyrrole, or an N-arylpyrrole, such as N-phenylpyrrole, or a substituted N-phenylpyrrole such as nitrophenylpyrrole, to obtain the corresponding conductive pyrrole homopolymer. For production of a conductive copolymer, a mixture of pyrrole and a C-or an N-substituted derivative of pyrrole, as described above, can be employed. The use of substituted pyrroles generally results in lower conductivity polymers than the parent polypyrrole. Hence, the use of pyrrole is preferred for higher conductivity applications.

The oxidation of pyrrole or a substituted derivative thereof to produce the conductive pyrrole polymer is carried out in the presence of a strong oxidant. The term "strong oxidant" as employed herein is intended to denote any oxidizing substance which is capable of oxidizing pyrrole or a substituted derivative thereof, as defined above, to produce polypyrrole or a pyrrole copolymer.

Examples of strong oxidants include the cations $Fe^{3+}$, $Cu^{2+}$, $Ce^{4+}$, $NO^+$, $NO_2^+$ and $(C_6H_5)_3C^+$. Examples of compounds providing the above cations as oxidizing agents are the soluble salts of the above cations, such as ferric perchlorate, ferric chloride, cupric fluoborate, cupric perchlorate, nitrosyl hexafluorophosphate, triphenylmethyl fluoborate, ceric sulfate and the like.

Other suitable oxidizing agents, such as anion, e.g., the persulfate anion, halogens, oxygen, permanganate and dichromate in acidic media, can be employed.

Further, instead of employing oxidants in the form of cations or anions, neutral oxidants, such as hydrogen peroxide in an acid solution, e.g., in dilute sulfuric acid, can be employed.

The reaction is generally carried out in a suitable solvent. The solvents used can be any organic solvent in which pyrrole and the oxidant are soluble and which does not interfere with the desired oxidation reaction. Such solvents include alcohols, ethers, e.g., dioxane, acetone, acetonitrile, tetrahydrofuran, methylene chloride, dichloromethane and the like. Water, alone or in combination with a water miscible solvent, also can be employed. The solvent can be initially present in the oxidant or in the pyrrole solution, or both.

The concentration of the pyrrole in the solvent, when used, can vary but, generally, is in the range from about 0.03 to about 2 molar.

The concentration of oxidant material or cation in aqueous or solvent solution can range from about 0.001 to about 2 molar, preferably about 0.5 molar, and the concentration of non-nucleophilic anion or anion-producing material also can range from about 0.001 to about 2 molar, preferably about 0.5 molar.

A material providing substantially non-nucleophilic anions functioning as dopant for the pyrrole polymer is also employed, preferably in conjunction with the oxidant. These anions are generally strong acid anions, such as sulfate, bisulfate, perchlorate, fluoborate, $PF_6^-$, $AsF_6^-$ and $SbF_6^-$ anions. Chloride anion also can be used, even though it is somewhat nucleophilic.

Examples of compounds providing such anions are the free acids and the soluble salts of such acids, e.g., the alkali metal salts. Examples of such compounds include sulfuric acid, sodium sulfate, sodium bisulfate, sodium perchlorate, ammonium fluoborate, hydrogen hexafluoroarsenate and the like. In addition, the non-nucleophilic anion can be a sulfonate salt or sulfonic acid anion derived from an organic sulfonate or an organic sulfonic acid, e.g., as provided by p-toluenesulfonate and polymeric sulfonates, e.g., polystyrenesulfonate and polyvinylsulfonate, and trifluoromethylsulfonate, $CF_3SO_3^-$. Also organic sulfate anion, such as dodecylsulfate, can be employed.

Although the oxidant as cation and the non-nucleophilic anion can be provided by separate compounds, a convenient manner for providing both the strong oxidant and non-nucleophilic anion is in the form of a salt incorporating both the oxidant cation and the non-nucleophilic anion, as oxidant counterion, as exemplified by the above-noted compounds, ferric perchlorate, ferric chloride, ferric sulfate, ceric sulfate, cupric fluoborate, cupric perchlorate, and the nitrosyl and triphenylmethyl salts, e.g., nitrosyl hexafluorophosphate and, also, alkyl and aryl sulfonates, e.g., ferric ethylbenzenesulfonate and ferric dodecylenzenesulfonate.

The reaction between the pyrrole and the oxidant is generally carried out at substantially ambient or room temperature. However, the temperature can be higher or lower and may change the electrical conductivity of the resulting polypyrrole powder. Also, in preferred practice, such treatments are carried out in the presence of oxygen in the air.

The reaction is conveniently carried out by slowly adding the liquid pyrrole, e.g., dropwise, to the oxidant solution with stirring. A black precipitate forms almost immediately, and continues to form until addition of the pyrrole is complete. The reaction mixture is then stirred for a period of time, e.g., for 1 or more hours, to assure completeness of reaction.

The reaction mixture is then filtered and the solid washed, e.g., with water and acetone, or with acetonitrile. The dry polypyrrole powder comprised of a pyrrole polymer cation and a substantially non-nucleophilic anion as dopant, has good electrical conductivity.

The following are examples of practice of the invention, it being understood that such examples are only illustrative and in no sense limitative of the invention.

EXAMPLE I

To 70 grams (0.125 mole) of $Fe_2(SO_4)_3.9H_2O$ in 180 mls of water was added dropwise with good stirring 3.35 grams (0.05 mole) of liquid pyrrole. A black precipitate formed immediately; the addition was complete in 15 minutes. The reaction mixture was stirred at room temperature for 4 hours. It was then filtered, and the solid was washed well with both water and acetone. The resulting conductive polypyrrole powder (3.8 grams) had a conductivity of 0.5 $ohm^{-1}cm^{-1}$.

EXAMPLE II

To 60 grams (0.15 mole) of $Ce(SO_4)_2.4H_2O$ dissolved in 1400 mls of 10% sulfuric acid was added slowly with good stirring 3.35 grams (0.05 mole) of pyrrole. The addition was complete in 15 minutes; the reaction mixture was then stirred at room temperature overnight. The resulting black conductive polypyrrole (1.4 grams) was filtered and washed well with both water and acetone. The dry solid powder had a conductivity of 4 $ohm^{-1}cm^{-1}$.

EXAMPLE III

To 26 grams (0.15 mole) of $NOPF_6$ in 100 mls of acetonitrile was added dropwise with good stirring 3.35 grams (0.05 mole) of pyrrole in 10 mls of acetonitrile. An immediate black precipitate was observed; the addition was completed in 20 minutes. The reaction mixture was stirred an additional hour at room temperature, and the black solid was then filtered and washed well with acetonitrile. The dry conductive polypyrrole powder (2.1 grams) had a conductivity of 24 $ohm^{-1}cm^{-1}$.

EXAMPLE IV

To 24.3 grams (0.15 mole) of ferric chloride dissolved in 200 mls of acetonitrile was added slowly with good stirring, 3.35 grams (0.05 mole) of pyrrole. A black precipitate formed immediately; the addition was completed in 15 minutes. The reaction mixture was then stirred for an additional hour at room temperature. The solid was filtered and washed well with acetonitrile. The dry conductive polypyrrole powder (1.36 grams) had a conductivity of 50 $ohm^{-1}cm^{-1}$.

EXAMPLE V

The procedure of Example I is followed, except that in place of liquid pyrrole, a mixture of 70 mole % pyrrole and 30 mole % N-methyl-pyrrole is employed.

In this example, a conductive copolymer powder of pyrrole and N-methylpyrrole is formed.

The conductive polypyrrole powder produced by the invention process can be impregnated with a suitable encapsulating resin, such as an epoxy resin, by mixing such powder with the encapsulating resin and curing the resin. In addition to the preferred epoxy resins, suitable resins for this purpose include polyimide and bis-maleimide resins.

The encapsulated conductive materials thus produced have application as conductive composite structural materials, semi-conductor components, in antistatic applications, in electromagnetic interference shielding applications, and as electrical conductors. In addition, the electrical properties of such encapsulated conductive polypyrrole powder materials remain stable in potentially hostile environments, such as at high temperatures, e.g., 250° F.; at high relative humidity, e.g., 90%, and high temperatures, e.g., 160° F.; and in high oxygen atmospheres, e.g., 100% $O_2$ at room temperature; in each case, the encapsulated polypyrrole material remains stable over extended time periods, e.g., 7 days. Such encapsulated polypyrrole materials also have long-term shelf life stability, e.g., up to 6 months.

An example of encapsulation of the conductive polypyrrole powder produced according to the invention is as follows:

EXAMPLE VI

The polypyrrole powder produced in Example IV was stirred into an epoxy resin/curing agent mixture consisting of Shell Epon 9102 and Shell CA 9150 curing agent (an acid-anhydride system), in a 3-6/10 weight ratio of the conductive powder to the above epoxy resin/curing agent mixture, spread flat onto a Teflon-coated fabric to which it would not stick when pre-cured.

The above system was pre-cured at 180° F. for 15 minutes and then subjected to a cure cycle in a high pressure press at 350° F. and 100 psi for 1 hour.

The encapsulation of polypyrrole powder in a resin such as an epoxy resin, as described above, is disclosed in U.S. application Ser. No. 883,253 filed July 8, 1986 now abandoned, of E. F. Witucki, L. F. Warren and P. R. Newman, and assigned to the same assignee as the present application, and is incorporated herein by reference.

From the foregoing, it is seen that the invention provides a novel process for chemical deposition of conductive polypyrrole powder.

Since various changes and modifications of the invention will occur to, and can be made readily by, those skilled in the art, without departing from the invention concept, the invention is not to be taken as limited except by the scope of the appended claims.

What is claimed is:

1. A process for producing electrically conductive polypyrrole powder which comprises:
    treating a liquid pyrrole with a solution of a strong oxidant capable of oxidizing pyrrole to a pyrrole polymer, said strong oxidant being a cation selected from the group consisting of $Fe^{3+}$, $Cu^{2+}$, $Ce^{4+}$, $NO^+$, $NO_2^+$ and $(C_6H_5)_3C^+$ cations, and
    oxidizing said pyrrole by said strong oxidant in the presence of a substantially non-nucleophilic anion, and precipitating a conductive polypyrrole powder.

2. The process of claim 1, said pyrrole monomer selected from the group consisting of pyrrole, a 3- and 3,4-alkyl and aryl C-substituted pyrrole, an N-alkylpyrrole and an N-arylpyrrole.

3. The process of claim 1, said oxidant being present in a concentration in the range of about 0.001 to about 2 molar, and said non-nucleophilic anion being present in a concentration in the range from about 0.001 to about 2 molar.

4. The process of claim 1, said non-nucleophilic anion being selected from the group consisting of sulfate, bisulfate, perchlorate, chloride, fluoborate, $PF_6^-$, $AsF_6^-$, and $SbF_6^-$ anions.

5. The process of claim 4, said non-nucleophilic anion being derived from the free acids or the soluble salts of said acids.

6. The process of claim 1, said oxidant and said non-nucleophilic anion being provided by a compound selected from the group consisting of ferric perchlorate, ferric chloride, ceric sulfate, cupric fluoborate, cupric perchlorate, and nitrosyl hexafluorophosphate.

7. The process of claim 1, the reaction being carried out in aqueous or organic solvent medium in which said pyrrole and said oxidant are soluble and which does not interfere with the oxidation reaction.

8. A process for producing electrically conductive polypyrrole powder which comprises:
    contacting a pyrrole and a strong oxidant capable of oxidizing pyrrole to a pyrrole polymer, at substantially room temperature, in an aqueous or organic solvent medium in which said pyrrole and said oxidant are soluble and which does not interfere with the oxidation reaction, said strong oxidant being a cation selected from the group consisting of $Fe^{3+}$, $Cu^{2+}$, $Ce^{4+}$, $NO^+$, $NO_2^+$ and $(C_6H_5)_3C^+$, cations, and
    oxidizing said pyrrole by said strong oxidant in the presence of a substantially non-nucleophilic anion, and precipitating a conductive polypyrrole powder comprising a pyrrole polymer cation and a substantially non-nucleophilic anion as dopant.

9. The process of claim 8, said pyrrole being liquid pyrrole, and said strong oxidant and said non-nucleophilic anion being provided by ferric chloride or ferric sulfate.

10. The process of claim 8, said pyrrole being liquid pyrrole, and said strong oxidant and said non-nucleophilic anion being provided by ceric sulfate.

11. An electrically conductive polypyrrole powder produced by the process of claim 1.

12. An electrically conductive polypyrrole powder produced by the process of claim 2.

13. An electrically conductive polypyrrole powder produced by the process of claim 4.

14. An electrically conductive polypyrrole powder produced by the process of claim 8.

15. An electrically conductive polypyrrole powder produced by the process of claim 9.

* * * * *